(12) United States Patent
Kiehlbauch et al.

(10) Patent No.: US 7,964,471 B2
(45) Date of Patent: Jun. 21, 2011

(54) METHODS OF FORMING CAPACITORS

(75) Inventors: Mark Kiehlbauch, Boise, ID (US);
Kevin R. Shea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/716,395

(22) Filed: Mar. 3, 2010

(65) Prior Publication Data

US 2010/0159667 A1 Jun. 24, 2010

Related U.S. Application Data

(63) Continuation of application No. 12/114,129, filed on May 2, 2008, now Pat. No. 7,696,056.

(51) Int. Cl.
H01L 21/20 (2006.01)
(52) U.S. Cl. ........ 438/396; 438/250; 438/253; 438/381; 438/296; 438/255; 257/68; 257/71; 257/296
(58) Field of Classification Search .................. 438/396, 438/250, 253, 381, 296, 255, 613; 257/68, 257/71, 296
See application file for complete search history.

(56) References Cited

U.S. PATENT DOCUMENTS

| | | | |
|---|---|---|---|
| 5,874,335 A | 2/1999 | Jenq et al. | |
| 5,998,259 A | 12/1999 | Chuang | |
| 6,037,216 A | 3/2000 | Liu et al. | |
| 6,130,102 A | 10/2000 | White, Jr. et al. | |
| 6,146,962 A | 11/2000 | Kalnitsky et al. | |
| 6,174,781 B1 | 1/2001 | Kai et al. | |
| 6,300,235 B1 | 10/2001 | Feldner et al. | |
| 6,630,380 B1 | 10/2003 | Cheng et al. | |
| 7,009,232 B2 | 3/2006 | Keeth et al. | |
| 7,229,895 B2 | 6/2007 | Wells | |
| 7,285,812 B2 | 10/2007 | Tang et al. | |
| 7,326,656 B2 | 2/2008 | Brask et al. | |
| 7,465,680 B2 | 12/2008 | Chen et al. | |
| 7,618,874 B1 | 11/2009 | Shea et al. | |
| 2001/0018124 A1 | 8/2001 | Yamakawa et al. | |
| 2002/0149044 A1 | 10/2002 | Nakanishi et al. | |
| 2004/0135182 A1 | 7/2004 | An et al. | |
| 2004/0147074 A1 | 7/2004 | Sell et al. | |
| 2005/0030697 A1 | 2/2005 | Wu et al. | |
| 2005/0088895 A1 | 4/2005 | Manger et al. | |

(Continued)

FOREIGN PATENT DOCUMENTS

KR 20020058335 7/2002

(Continued)

OTHER PUBLICATIONS

Arima et al., "A Novel Stacked Capacitor Cell with Duel Cell Plate for 64Mb DRAMs", LSI Research and Development Laboratory, pp. 27.2.1-27.2.4, 1990 IEEE.

(Continued)

*Primary Examiner* — Matthew S Smith
*Assistant Examiner* — Wilner Jean Baptiste
(74) *Attorney, Agent, or Firm* — Wells St. John P.S.

(57) ABSTRACT

A method of forming a capacitor includes providing material having an opening therein over a node location on a substrate. A shield is provided within and across the opening, with a void being received within the opening above the shield and a void being received within the opening below the shield. The shield is etched through within the opening. After the etching, a first capacitor electrode is formed within the opening in electrical connection with the node location. A capacitor dielectric and a second capacitor electrode are formed operatively adjacent the first capacitor electrode.

30 Claims, 16 Drawing Sheets

U.S. PATENT DOCUMENTS

| | | |
|---|---|---|
| 2006/0138516 A1 | 6/2006 | Chae |
| 2006/0211178 A1 | 9/2006 | Kim et al. |
| 2007/0001208 A1 | 1/2007 | Graham et al. |
| 2007/0026540 A1 | 2/2007 | Nooten et al. |
| 2007/0111606 A1 | 5/2007 | Goodwin |
| 2007/0173014 A1 | 7/2007 | Manning et al. |
| 2007/0207622 A1 | 9/2007 | Rana et al. |
| 2007/0238259 A1 | 10/2007 | Bhat et al. |
| 2009/0275187 A1 | 11/2009 | Kiehlbauch et al. |

FOREIGN PATENT DOCUMENTS

| | | |
|---|---|---|
| KR | 20040046853 | 11/2002 |
| TW | 382772 | 2/2000 |
| TW | 416140 | 12/2000 |
| TW | 417292 | 1/2001 |
| TW | 423148 | 2/2001 |
| TW | 427002 | 3/2001 |
| WO | WO02/41366 | 5/2002 |

OTHER PUBLICATIONS

Cho et al., "Integrated Device and Process Technology for sub-70nm Low Power DRAM", 2004 Symposium on VLSI Technology Digest of Technical Papers, pp. 32-33.

Curanovic, "Development of a Fully-Depleted Thin-Body FinFET Process", Department of Microelectronic Engineering, College of Engineering, Rochester Institute of Technology, Nov. 2003, pp. 1-102.

Iyer et al., "Embedded DRAM technology: opportunities and challenges", IEEE Spectrum, pp. 56-64, Apr. 1999.

Park et al., "Highly Manufacturable 90nm DRAM technology", 2002 IEEE, pp. 33.1.1-33.1.4.

Suh et al., "Characterization of Three-Dimensional Capacitor Prepared by Oxide Recess in Shallow Trench Isolation", Journal of The Electrochemical Society, pp. G107-G109, 2005.

Terry, "A holistic investigation of alternative gate stack materials for future CMOS applications", A dissertation submitted to the Graduate Faculty of North Carolina State University, Chemical Engineering, 2006, pp. 1-127.

Xu et al., "Characterization of 1.9- and 1.4-nm Ultrathin Gate Oxynitride by Oxidation of Nitrogen-implanted Silicon Substrate", IEEE Transactions on Electron Devices, vol. 51, No. 1, Jan. 2004, pp. 113-120.

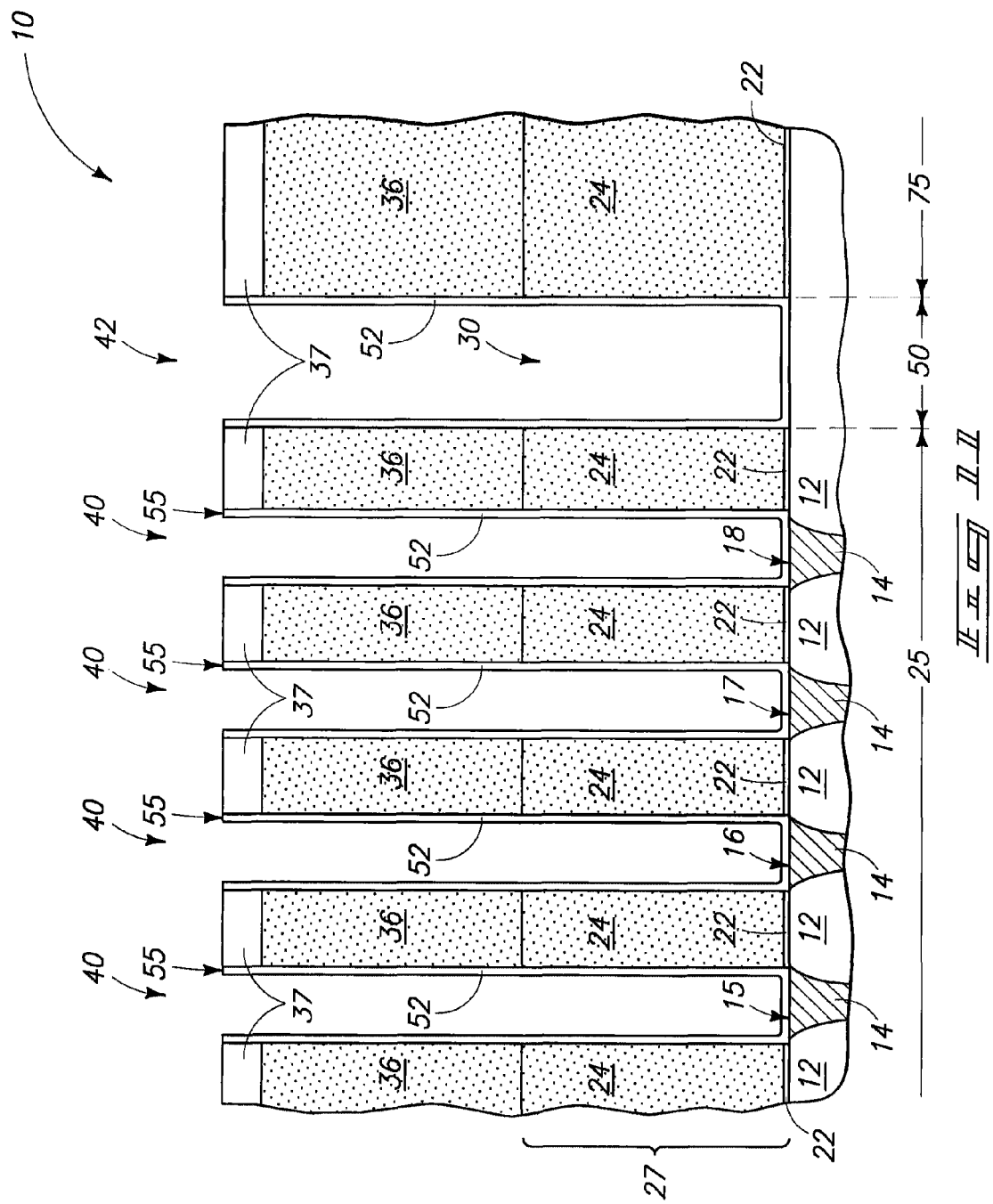

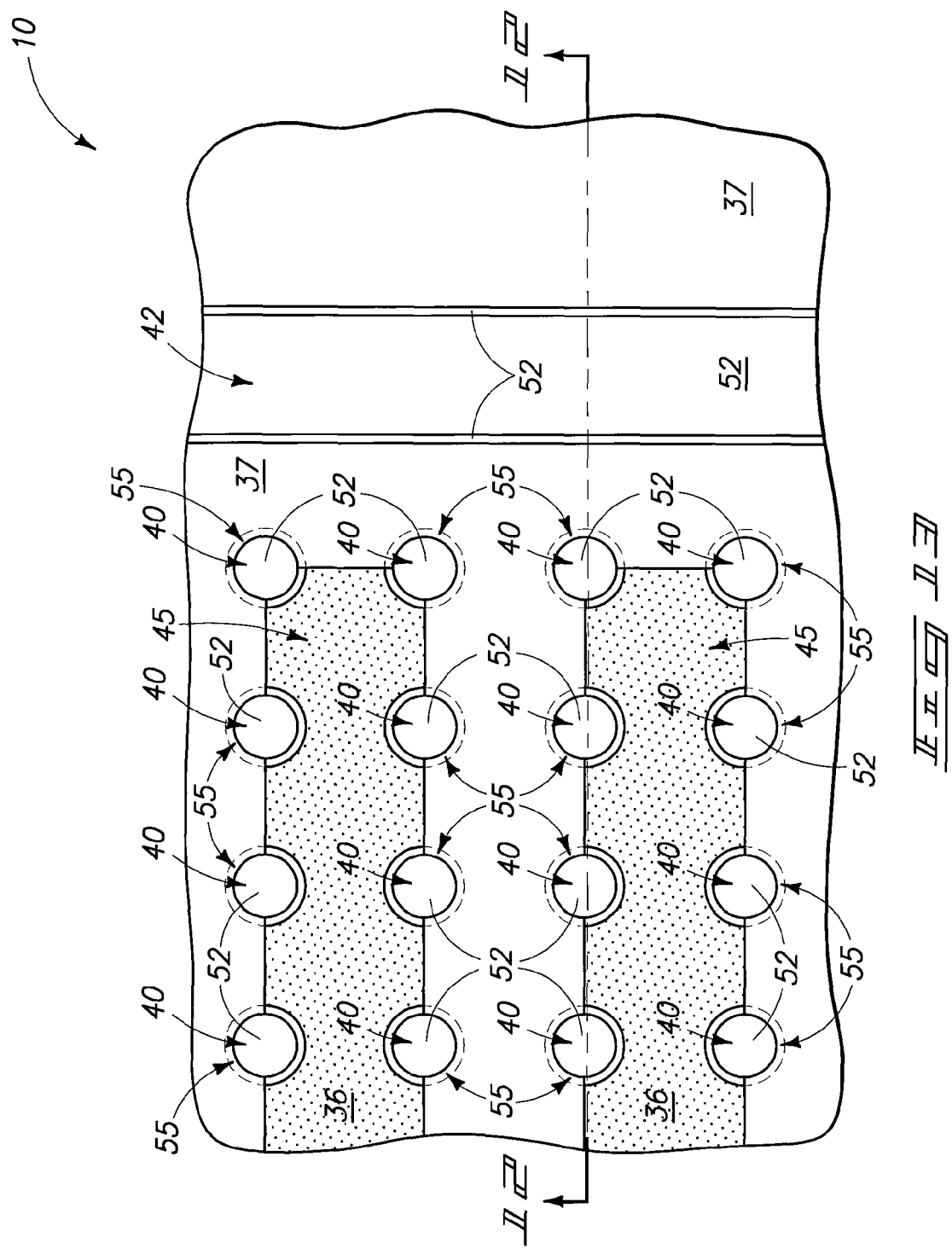

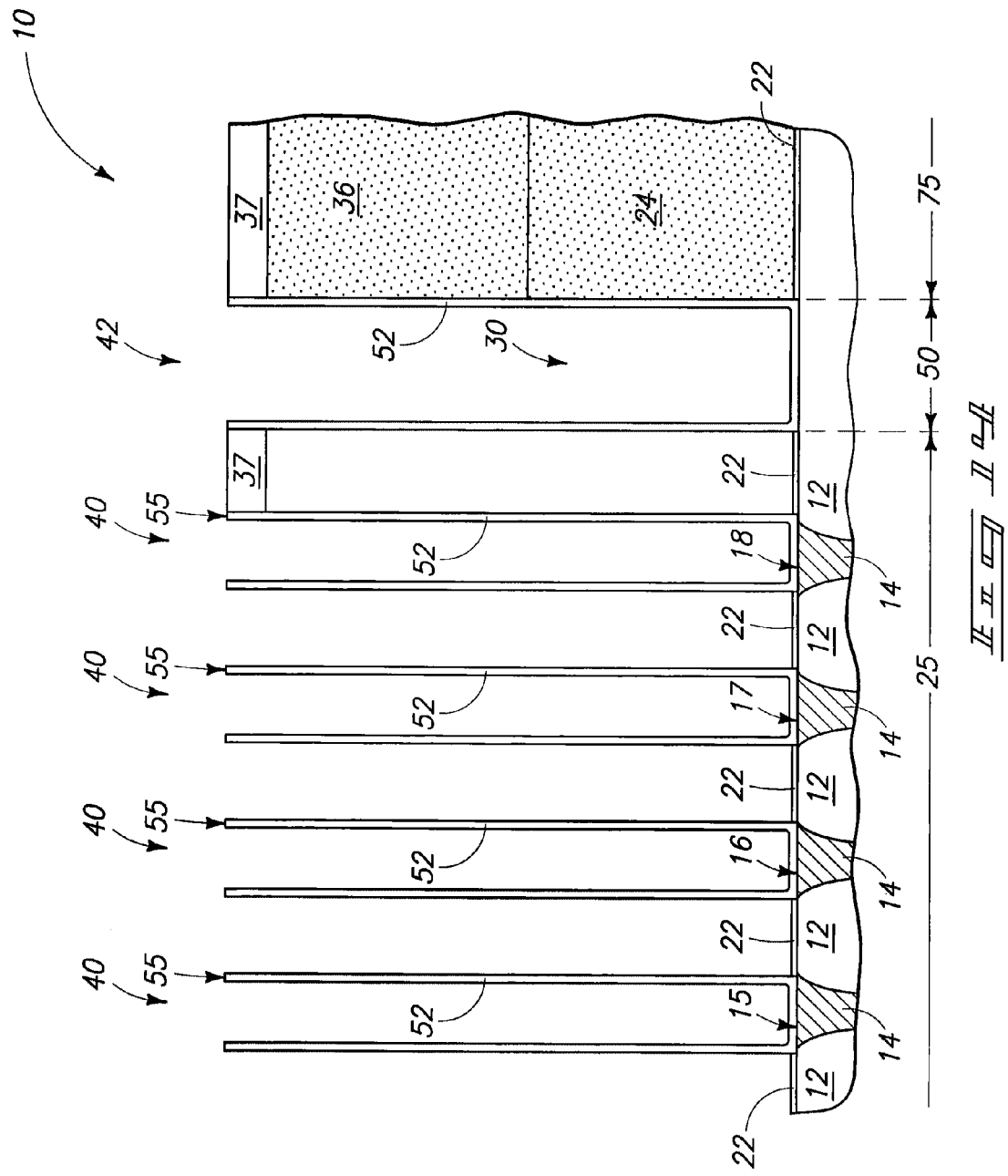

METHODS OF FORMING CAPACITORS

RELATED PATENT DATA

This patent resulted from a continuation application of U.S. patent application Ser. No. 12/114,129, filed May 2, 2008, entitled "Methods of Forming Capacitors", naming Mark Kiehlbauch and Kevin R. Shea as inventors, the disclosure of which is incorporated by reference.

TECHNICAL FIELD

Embodiments disclosed herein pertain to methods of forming capacitors.

BACKGROUND

Capacitors are one type of component commonly used in the fabrication of integrated circuits, for example in DRAM circuitry. A capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared to the vertical dimension. In many instances, the vertical dimension of capacitors has increased.

One manner of fabricating capacitors is to initially form an insulative material within which a capacitor storage node electrode is formed. For example, an array of capacitor electrode openings for individual capacitors may be fabricated in such insulative capacitor electrode-forming material, with an example insulative electrode-forming material being silicon dioxide doped with one or both of phosphorus and boron. The capacitor electrode openings may be formed by etching. It can be difficult to etch the capacitor electrode openings within the insulative material, particularly where the openings have high aspect ratio.

One manner of reducing such difficulty is to split the deposition and etch of such openings into two or more combinations of deposition and etch steps. For example, the material within which the capacitor electrode openings are to be formed can be deposited to an initial deposition thickness which is one half or less of the desired ultimate deposition thickness. Shallower capacitor electrode openings can then be etched to the underlying node location. Such openings are subsequently completely filled/plugged, and another material within which capacitor electrode openings will be formed is deposited over the material in which the first openings were formed and filled. Individual capacitor electrode openings are then formed through the overlying layer to the plugging material. Such can be repeated if desired. Regardless, the plugging material is at some point etched from the capacitor electrode openings to enable contact to be made to a node location on the substrate.

One common plugging material used in such instances is polysilicon. A native oxide can form on the outermost surfaces thereof that can be difficult to remove. Such oxide can be removed by etching prior to etching the polysilicon within the openings from the substrate. The native oxide etch is usually conducted using an HF wet etching solution. However, the material within which the capacitor electrode openings are usually formed is a doped silicon dioxide, such as borophosphosilicate glass or phosphosilicate glass. The HF will etch such material, thereby undesirably widening the capacitor electrode openings above the plugging material while removing the native oxide received thereover. Further and regardless, it can be difficult to remove the polysilicon plugging material from the openings. Example techniques in accordance with the above are described in U.S. Pat. Nos. 6,365,453 and 6,204,143.

Further and regardless, it is often desirable to etch away most if not all of the capacitor electrode-forming material after individual capacitor electrodes have been formed within the openings. Such enables outer sidewall surfaces of the electrodes to provide increased area and thereby increased capacitance for the capacitors being formed. However, the capacitor electrodes formed in deep openings are often correspondingly much taller than they are wide. This can lead to toppling of the capacitor electrodes, either during the etching to expose the outer sidewalls surfaces, during transport of the substrate, and/or during deposition of the capacitor dielectric layer or outer capacitor electrode layer. U.S. Pat. No. 6,667,502 teaches the provision of a brace or retaining structure intended to alleviate such toppling. Other aspects associated in the formation of a plurality of capacitors, some of which include bracing structures, are also disclosed and are:

U.S. Published Application No. 2005/0051822;
U.S. Published Application No. 2005/0054159;
U.S. Published Application No. 2005/0158949;
U.S. Published Application No. 2005/0287780;
U.S. Published Application No. 2006/0014344;
U.S. Published Application No. 2006/0051918;
U.S. Published Application No. 2006/0046420;
U.S. Published Application No. 2006/0121672;
U.S. Published Application No. 2006/0211211;
U.S. Published Application No. 2006/0263968;
U.S. Published Application No. 2006/0261440;
U.S. Published Application No. 2007/0032014;
U.S. Published Application No. 2006/0063344;
U.S. Published Application No. 2006/0063345.

Fabrication of capacitors in integrated circuitry such as memory circuitry may form an array of capacitors within a capacitor array area. Control or other circuitry area is often displaced from the capacitor array area, with the substrate including an intervening area between the capacitor array area and the control or other circuitry area. In some instances, a trench is formed in the intervening area between the capacitor array area and the other circuitry area. Such trench can be formed commensurate with the fabrication of the openings within the capacitor array area within which the isolated capacitor electrodes will be received.

While the invention was motivated in addressing the above-identified issues, it is no way so limited. The invention is only limited by the accompanying claims as literally worded, and in accordance with the doctrine of equivalence.

BRIEF DESCRIPTION OF THE DRAWINGS

FIG. 10 is a view of the FIG. 9 substrate at a processing step subsequent to that shown by FIG. 9.

FIG. 12 is a view of the FIG. 11 substrate at a processing step subsequent to that shown by FIG. 11, and taken through line 12-12 in FIG. 13.

FIG. 14 is a view of the FIG. 12 substrate at a processing step subsequent to that shown by FIG. 12.

DETAILED DESCRIPTION OF EXAMPLE EMBODIMENTS

Figure 1:
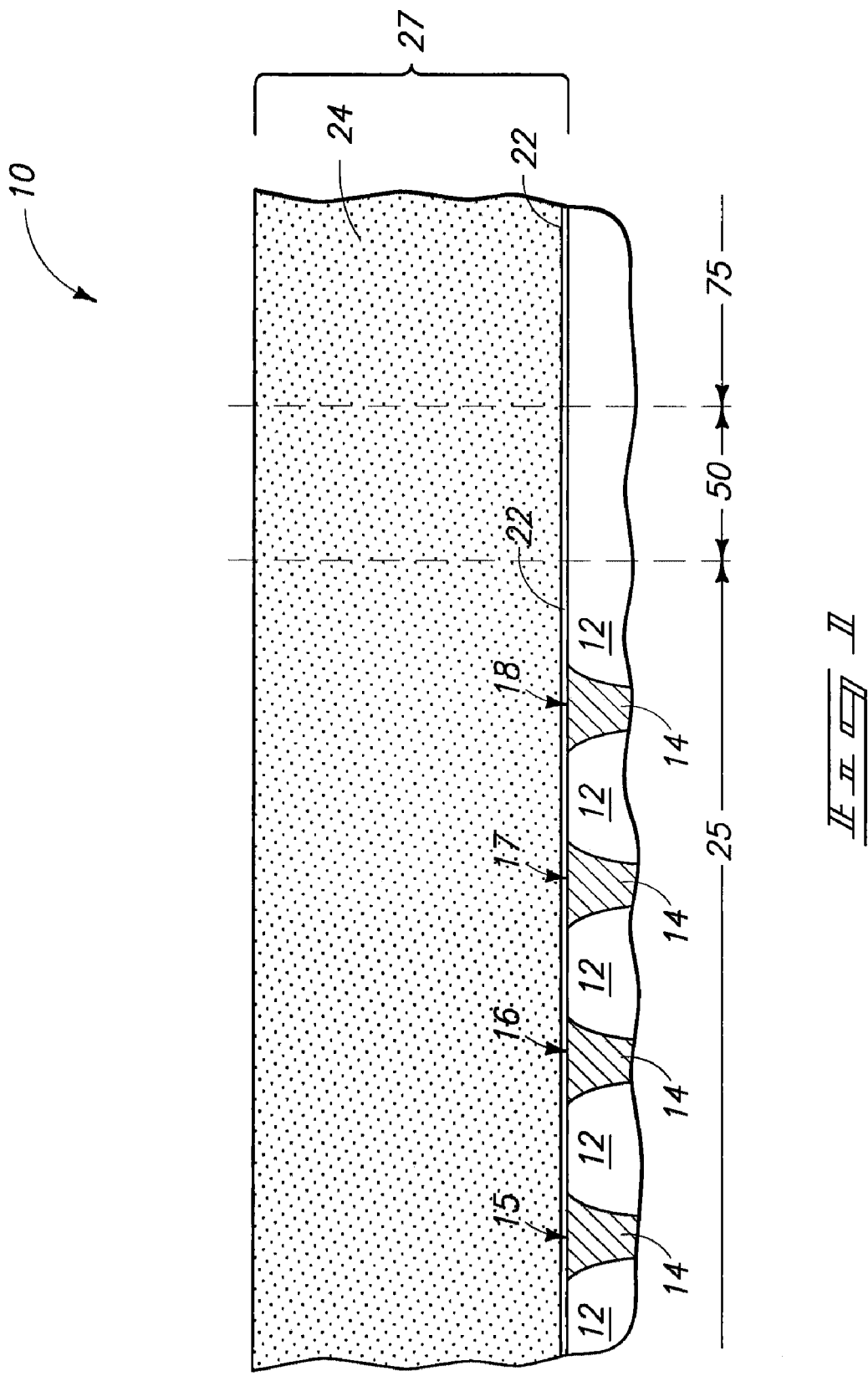
FIG. 1 is a diagrammatic cross section of a substrate fragment in process in accordance with an aspect of the invention.
Figure 2:
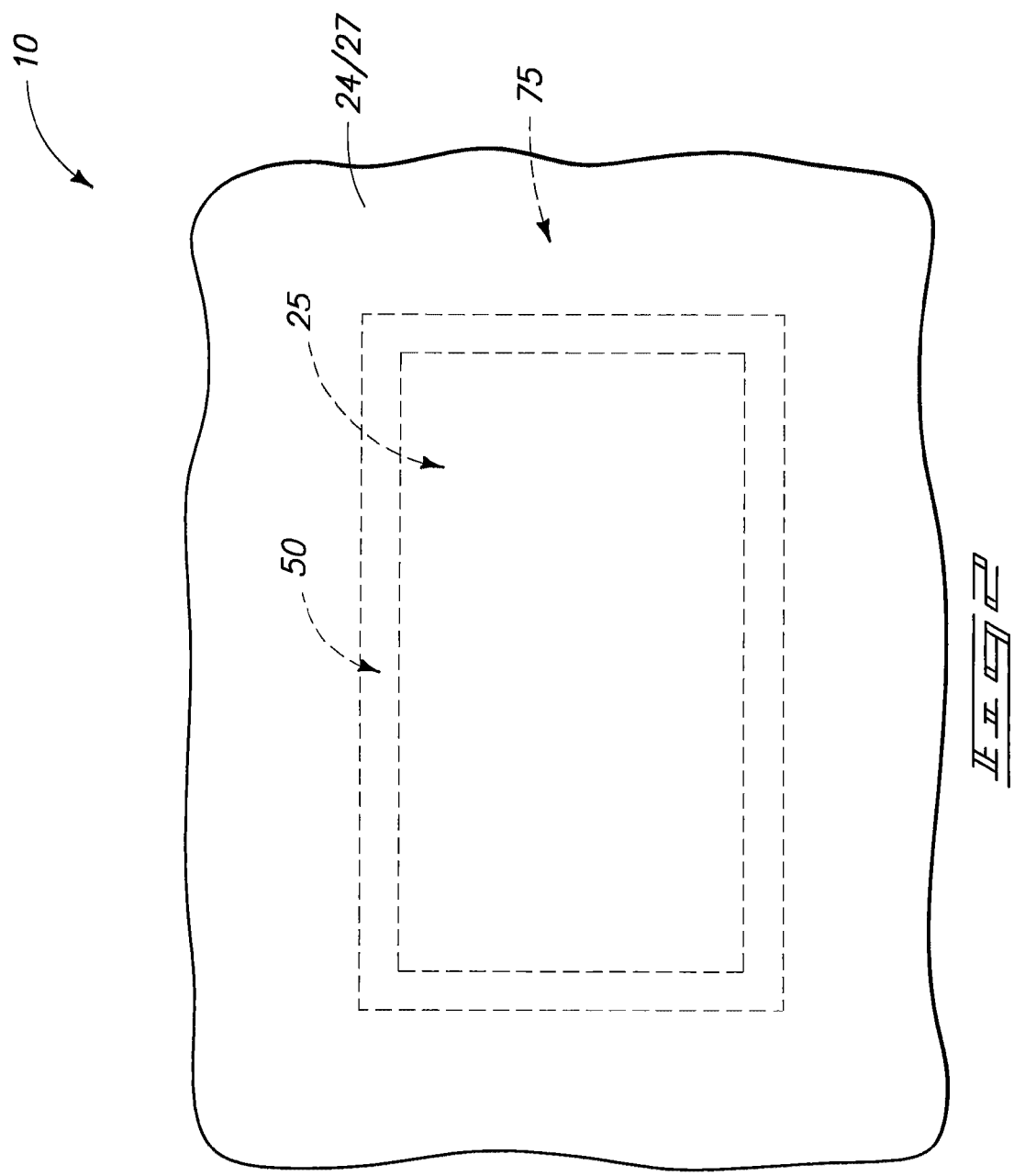
FIG. 2 is a diagrammatic top plan view of a larger scale portion of the FIG. 1 substrate.

Example methods of forming capacitors, including pluralities of capacitors, are described with reference to FIGS. 1-16. Referring initially to FIGS. 1 and 2, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, and by way of example only, FIG. 1 might comprise a bulk semiconductor material (not shown), for example bulk monocrystalline, and/or comprise semiconductor-on-insulator layers.

Substrate 10 can be considered as comprising a capacitor array area 25, a circuitry area 75 other than capacitor array area 25, and an intervening area 50 between capacitor array area 25 and circuitry area 75. In the depicted example embodiment, intervening area 50 completely surrounds and encircles capacitor array area 25 (FIG. 2), and circuitry area 75 comprises a peripheral circuitry area to that of capacitor array area 25. Alternate constructions are contemplated, of course, for example whereby neither intervening area 50 nor circuitry area 75 completely or partially encircles a capacitor array area 25.

FIG. 1 depicts an insulative material 12 having electrically conductive storage node pillars 14 formed therethrough. Materials 12 and 14 may be fabricated over some suitable underlying material, for example bulk monocrystalline and/ or underlying circuitry. Example insulative materials 12 include doped and undoped silicon dioxides, for example silicon dioxide deposited by the decomposition of tetraethylorthosilicate (TEOS) and/or borophosphosilicate glass (BPSG) and/or silicon nitride. In the context of this document, "doped silicon dioxide" or "silicon dioxide doped" requires at least 0.5 atomic percent concentration of one or a combination of boron or phosphorus in silicon dioxide. Further, an undoped silicon dioxide requires less than 0.5 atomic percent of any of boron and phosphorous. Alternately by way of example only, material 12 might comprise anisotropically etched insulative sidewall spacers, for example formed about transistor gate lines (not shown). An example material 14 is conductively doped polysilicon. Conductive material 14 can be considered as comprising or defining a plurality of capacitor storage node locations 15, 16, 17 and 18 on substrate 10. Storage node locations 15, 16, 17 and 18 are examples only, and regardless, may be conductive at this point in the process, or made conductive subsequently.

A material 22 has been formed over material 12 and capacitor storage node locations 15, 16, 17 and 18. Examples for material 22 comprise silicon nitride and/or undoped silicon dioxide deposited to an example thickness range of from about 100 Angstroms to about 2,000 Angstroms. Material 22 might be included to provide an etch stop, or other function.

Some material 24 is received over capacitor array area 25 and circuitry area 75, and also in the depicted embodiment over intervening area 50. Such might be homogeneous or comprise multiple different compositions and/or layers. An example material is doped silicon dioxide, for example comprising at least one of phosphorus and boron, such as BPSG, borosilicate glass (BSG), and/or phosphosilicate glass (PSG). An example thickness range for material 24 is from 5,000 Angstroms to 10 microns, with 2 microns being a specific example. Thinner and greater thicknesses are, of course, contemplated. Regardless and in one embodiment, layers 22 and 24 comprise example base material 27 received over node locations 15, 16, 17 and 18.

Figure 3:
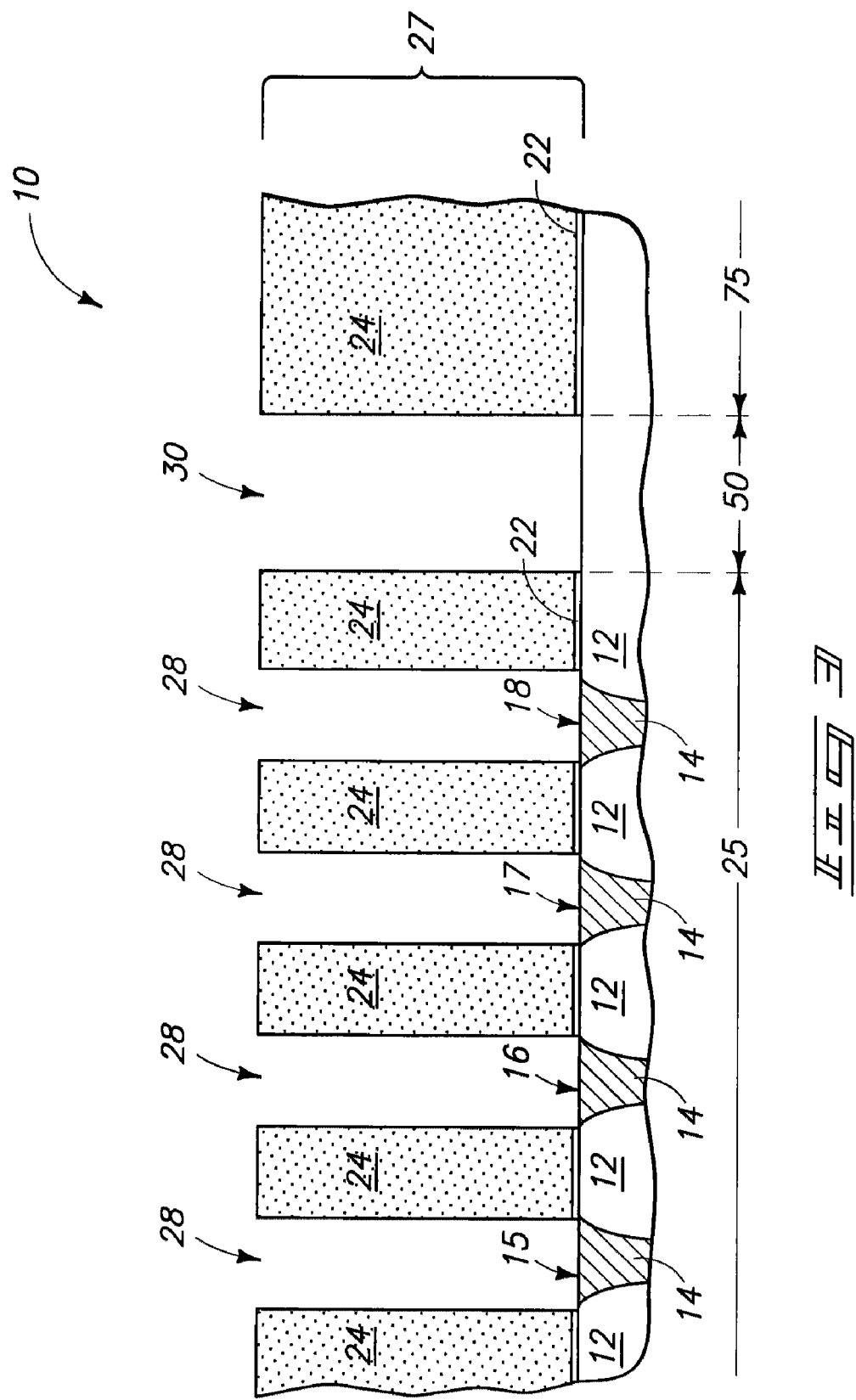
FIG. 3 is a view of the FIG. 1 substrate at a processing step subsequent to that shown by FIG. 1, and taken through line 3-3 in FIG. 4.
Figure 4:
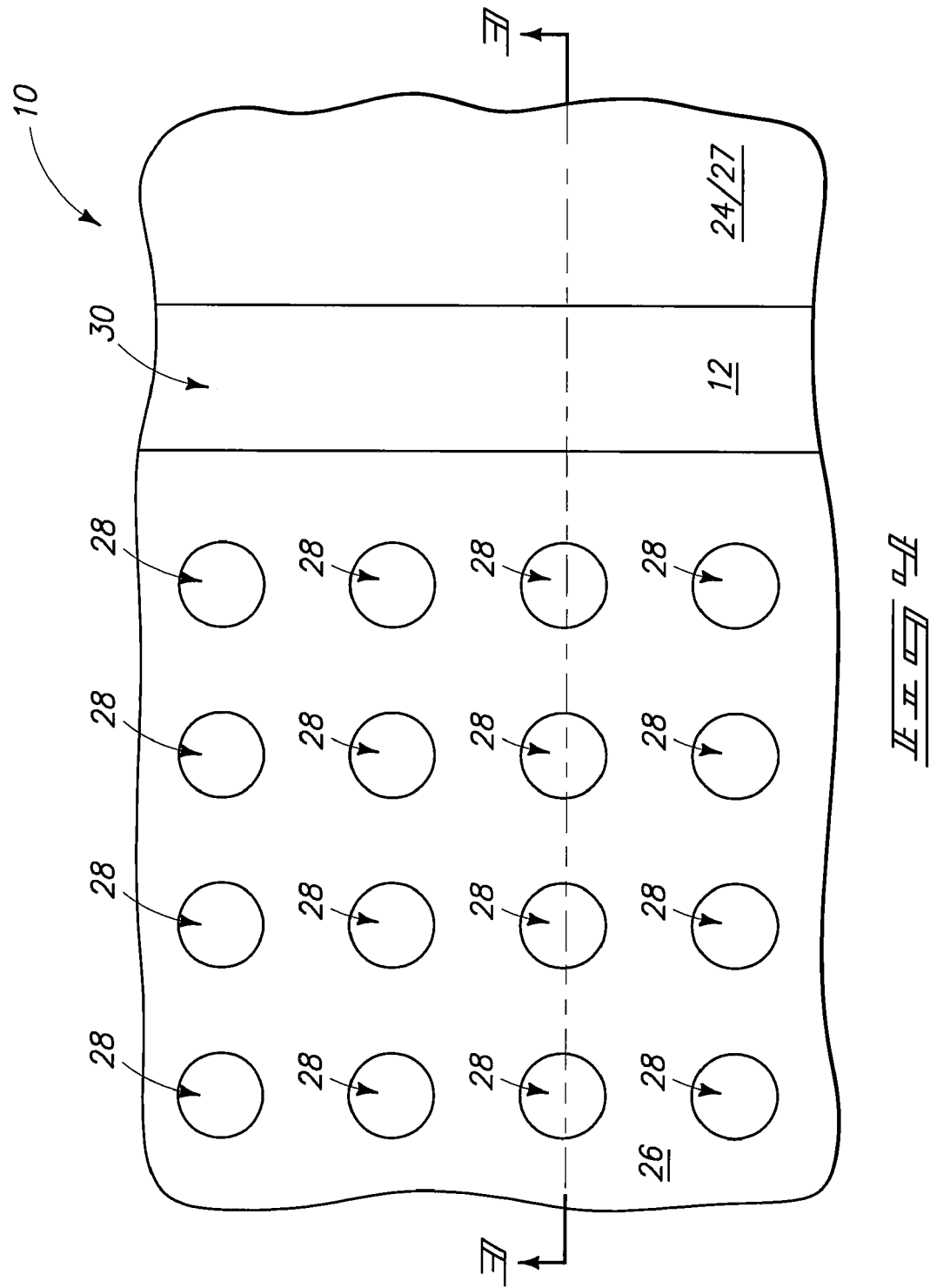
FIG. 4 is a diagrammatic top plan view of the FIG. 3 substrate fragment.

Referring to FIGS. 3 and 4, a plurality of openings 28 has been etched into base material 27 over individual node locations 15, 16, 17 and 18. Further, a trench 30 has been formed in intervening area 50 within base material 27. In one embodiment, trench 30 completely surrounds capacitor area 25. An example technique for forming capacitor electrode openings 28 and trench 30 comprises photolithographic patterning and selective anisotropic dry etch to produce the example FIGS. 3 and 4 constructions. An example minimum width of trench opening 30 is from about 200 Angstroms to about 5,000 Angstroms, while an example minimum width for capacitor electrode openings 28 is also from about 200 Angstroms to about 5,000 Angstroms. Trench 30 may or may not be formed at this point in the process, or at all. Regardless, the processing depicted by FIGS. 1-4 depicts but one example method of providing a material (i.e. material 27) having an opening therein (i.e. any of openings 28) over a node location (i.e. any of locations 15, 16, 17 and 18) on a substrate. The opening(s) may or may not extend completely to the node locations at this point in the process. Regardless in one embodiment, the processing depicted by FIGS. 3 and 4 can occur in a suitable processing tool which for convenience in description can be considered as a "first processing tool". In one embodiment the first processing tool may be a plasma etcher. By way of example only, a LAM™ Exelan™ oxide etch tool is an example such tool.

Figure 5:
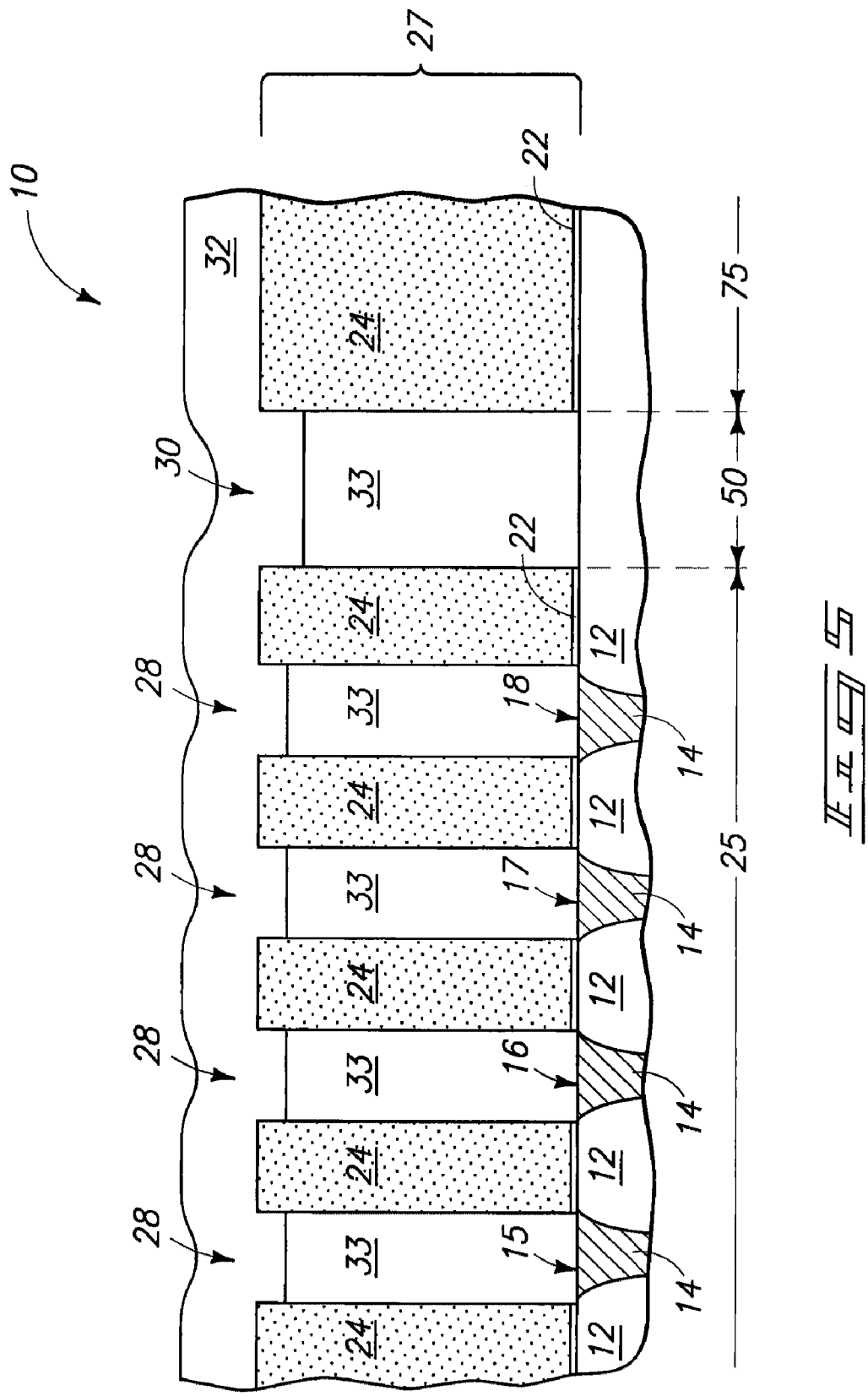
FIG. 5 is a view of the FIG. 3 substrate at a processing step subsequent to that shown by FIG. 3.

Referring to FIG. 5, bridging material 32 has been formed across base material openings 28, with such openings 28 comprising voids 33 therebeneath. In one embodiment, such occurs by depositing bridging material 32 over base material 27 and across base material openings 28, and in one embodiment to partially within base material openings 28 as shown. In one embodiment, such occurs in the very same first processing tool within which the etching to produce openings 28 in FIGS. 3 and 4 occurred, and in one embodiment before removing substrate 10 from such processing tool after such etching to produce openings 28. By way of examples only, example bridging materials include silicon dioxide-comprising material; polymers comprising C, H, and F; and combinations of these and other materials. Further by way of example, any silicon dioxide-comprising material may also include at least one of H, Cl, and F, for example provided in molar concentrations of from 10 to 20 percent of total atomic amount of silicon, oxygen and the at least one of H, Cl, and F. Regardless, these and/or other materials can be deposited by any existing or yet-to-be developed techniques. Example silicon-containing precursors for chemical or atomic layer deposition include $SiH_4$, $SiCl_4$, $SiCl_2H_2$, and $SiF_4$. Example carbon-containing precursors include $CH_4$, $CF_4$, $CH_2F_2$, $CHF_3$, $CH_3F$, $C_4F_6$, $C_4F_8$, $C_2F_4$, and $C_6F_6$. Example conditions during deposition within a plasma etcher or a plasma deposition tool include a chuck temperature of from 10° C. to 40° C., pressure from 10 mTorr to 200 mTorr, total power of from 500 watts to 2,000 watts and frequencies at one or a combination of 2 MHz and 27 MHz. Regardless, quantity of the atomic components of the composition of bridging material 32 can be controlled by quantity of precursor gases depending on the ultimate desired composition of bridging material 32. Composition of material 32, regardless, can be selected, controlled, and/or balanced in allowing greater or lesser resistance to subsequent processing steps (i.e. resistance to melting) and/or ease of subsequent removal of material 32 from openings 28, as is described below. Regardless, bridging material 32 might be homogenous or non-homogenous.

Figure 6:
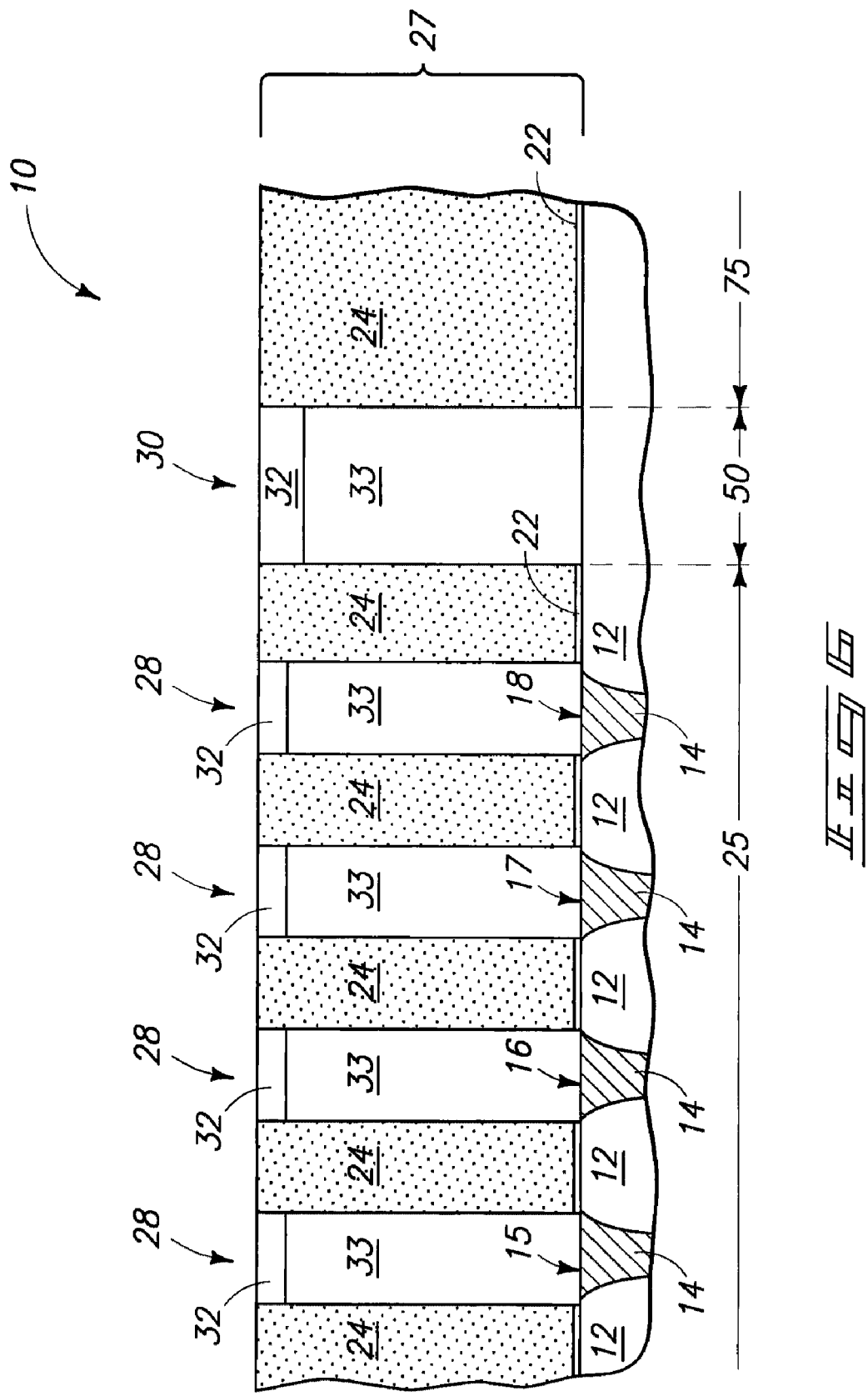
FIG. 6 is a view of the FIG. 5 substrate at a processing step subsequent to that shown by FIG. 5.

Referring to FIG. 6 and in one embodiment, bridging material 32 has been removed from being received over base material 27 and to leave bridging material 32 within and bridging across base material openings 28. An example manner for doing so includes chemical mechanical polishing. Alternately, removing of the bridging material might occur by an etching technique. For example in one embodiment, such could be etched by a timed etch within the first processing tool within which openings 28 were formed and bridging material 32 was formed. Regardless, FIGS. 5 and 6 depict, by way of examples only, methods of forming bridging material across base material openings which comprise a respective void beneath the bridging material.

Figure 7:
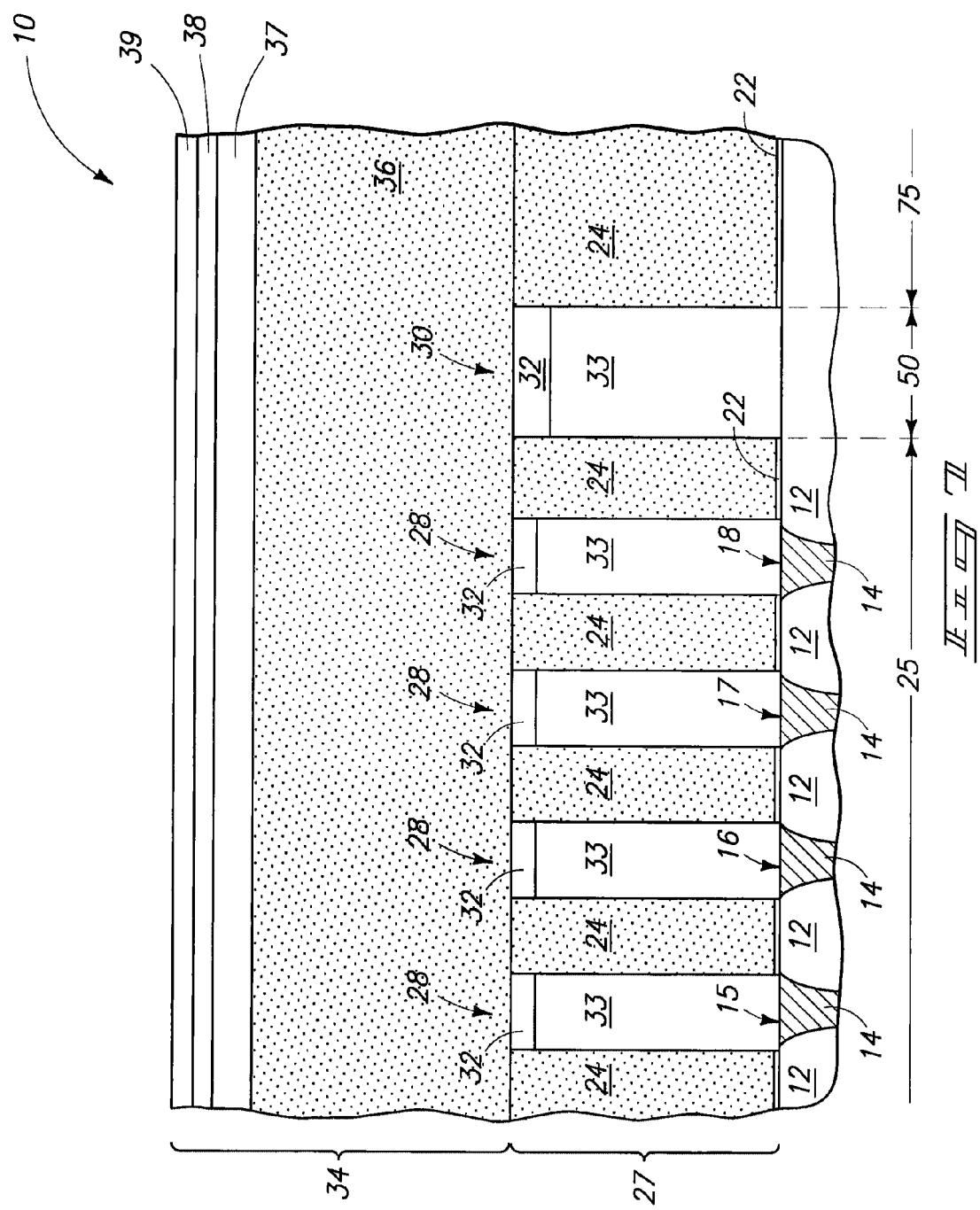
FIG. 7 is a view of the FIG. 6 substrate at a processing step subsequent to that shown by FIG. 6.

Referring to FIG. 7, covering material 34 has been formed over base material 27 and bridging material 32 received within openings 28. Such might be homogenous or non-homogenous, and regardless may comprise multiple layers. FIG. 7 depicts covering material 34 as comprising four layers 36, 37, 38, and 39. Any of such materials may be the same or different in composition as one or more components of base material 27. An example material 36 is doped silicon dioxide, an example material 37 comprises silicon nitride, and example materials for layers 38 and 39 include one or more different organic and/or inorganic antireflective coating layers. Regardless and in one embodiment, deposition of all of covering material 34 will comprise some highest deposition temperature in degrees C. at which any of such covering material 34 is deposited. For example, different materials 36, 37, and 38 may be deposited at different elevated temperatures, with one or two of such being deposited at some highest deposition temperature at which any of the components of covering material 34 are deposited. In such one embodiment, bridging material 32 is fabricated of a composition which will have a melting temperature in degrees C. which is at least 10% higher than said highest deposition temperature of any of covering material 34. For example in such embodiment, if layer 37 is the component of covering material 34 which has a highest deposition temperature of, for example, 350° C., bridging material 32 in such embodiment is fabricated to have a melting temperature of 385° C. or higher.

Figure 8:
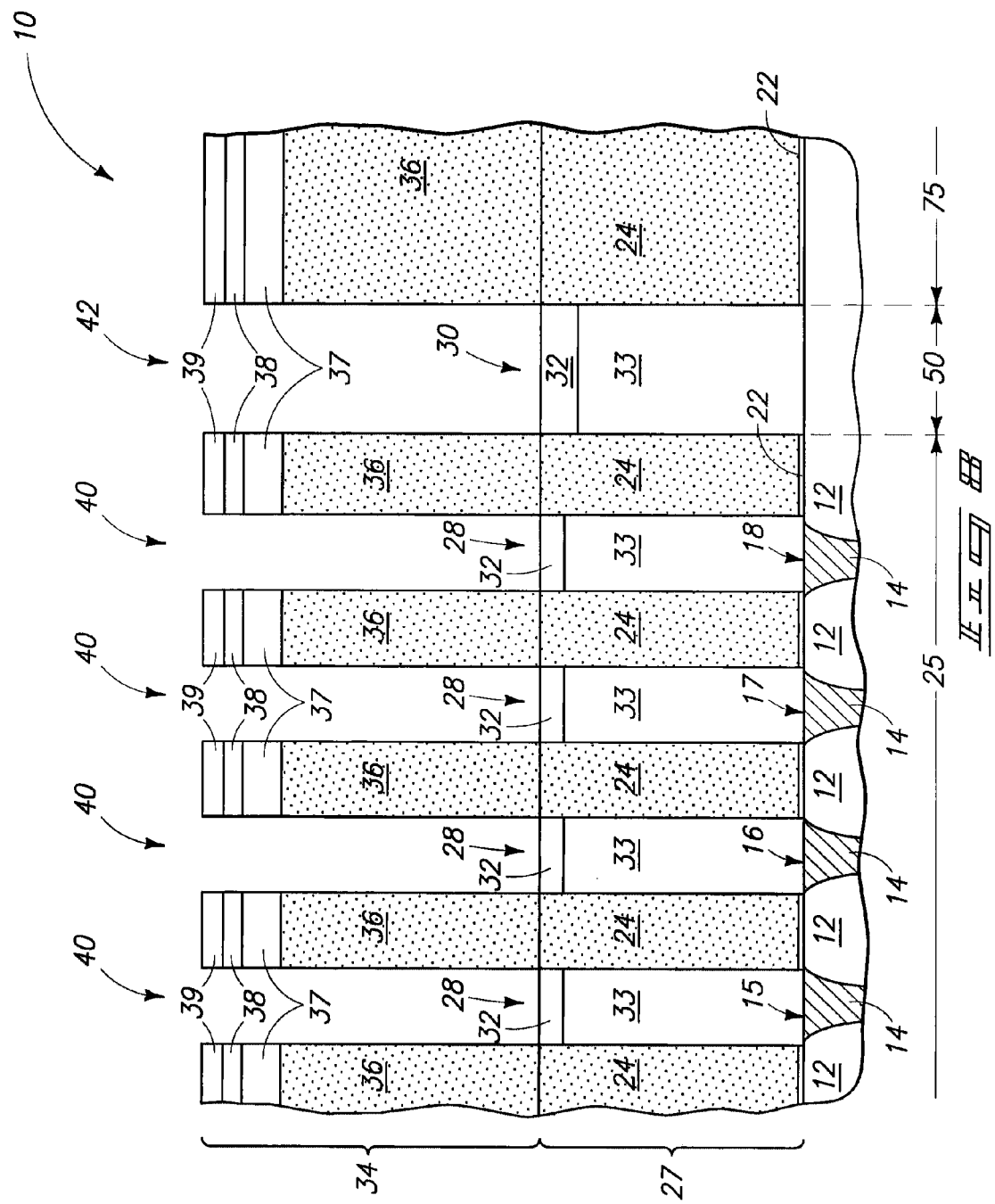
FIG. 8 is a view of the FIG. 7 substrate at a processing step subsequent to that shown by FIG. 7.

Referring to FIG. 8, openings 40 have been etched through covering material 34 to bridging material 32 received across base material openings 28. First capacitor electrodes will ultimately be formed therein as is described below. A trench 42, corresponding in general outline to trench 30, is also shown as having been etched through covering material 34 to bridging material 32 received within trench 30. Openings 40 and trench 42 are shown as being the same size, shape, and exactly aligned with the respective openings 28 and trench 30 over which such lie. However, such may be of different such size and shape, and regardless may not exactly align over the underlying openings and trench.

Figure 9:
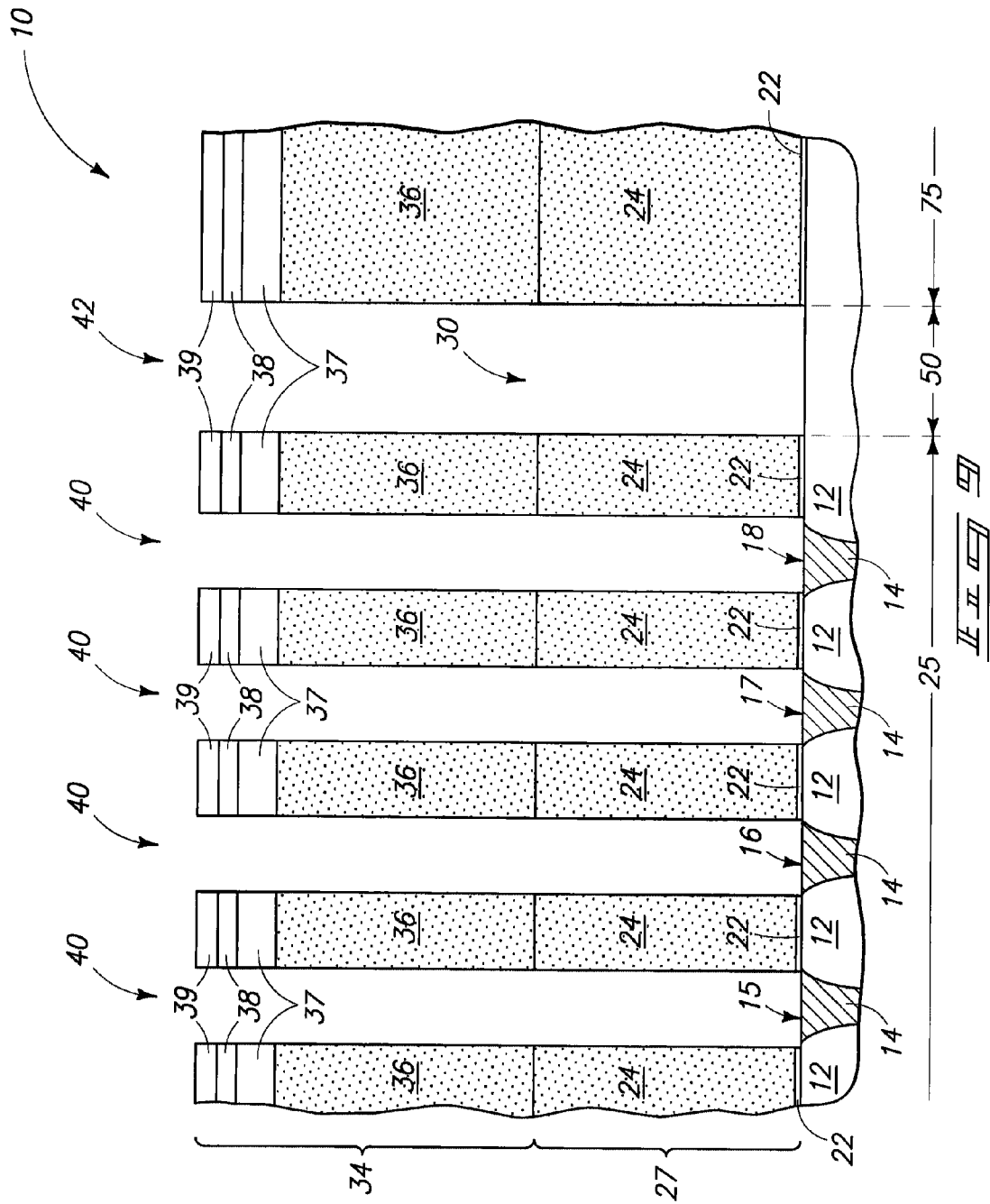
FIG. 9 is a view of the FIG. 8 substrate at a processing step subsequent to that shown by FIG. 8.

Referring to FIG. 9, bridging material 32 (not shown) has been etched through covering material openings 40 and 42. In one example embodiment and as shown, such etching through bridging material 32 in the processing going from FIG. 8 to FIG. 9 removes all remaining of such bridging material 32 which was received over base material openings 28 from substrate 10.

In one embodiment, the depicted etching of covering material openings 40 in FIG. 8 is conducted in a suitable processing tool which for convenience in description can be considered as a "second processing tool". In one embodiment, the second processing tool may be a plasma etcher, for example and by way of example only the LAM Exelan etcher referred to above. Regardless in one embodiment, the FIG. 9 etching is conducted within the very same processing tool used to form covering material openings 40 in FIG. 8, and in one embodiment before removing substrate 10 therefrom after etching such covering material openings 40. In one embodiment, the second processing tool may be the very same first processing tool as described above in the example embodiment where the FIGS. 3, 4, and 5 processing occurred in the same processing tool. Alternately and by way of example only, the first and second processing tools might be different tools, and whether of the same make and/or model or of different makes and/or models.

In one embodiment, etching of openings 40 through covering material 34 will comprise some suitable etching chemistry which extends the openings to bridging material 32, for example as is shown in FIG. 8. Where, for example, covering material 34 comprises multiple different compositions, some suitable etching chemistry will be used to extend openings 40 to bridging material 32 through the last portion of such covering material 34, for example through depicted layer 36. Different chemistries and/or etching conditions might be used for etching the materials received above layer 36. Regardless, where portion 36 of covering material 34 comprises PSG, an example etching chemistry to etch portion 36 and to produce the FIG. 8 construction includes a combination of $C_4F_8$, $O_2$ and Ar. Regardless, in one embodiment, the act of etching through bridging material 32 as depicted in FIG. 9 comprises continuing, without ceasing, the processing of substrate 10 with the etching chemistry at the conclusion of the etching of openings 40 through covering material 34 as depicted in FIG. 8 effective to etch through bridging material 32 (not shown) as shown by way of example in FIG. 9. Such may occur when bridging material 32 is of the same or similar composition to that of material 36, and/or where bridging material 32 received within openings 40 is sufficiently thin that punching therethrough can occur without necessarily changing etching chemistry. In one embodiment, such etching also consists essentially of continuing the processing, without ceasing, (for example of the substrate of FIG. 8) to produce the example substrate of FIG. 9 also using the very same etching conditions (meaning the combination of pressure, temperature, and any applied power) that were in use at the conclusion of the etching to produce the example FIG. 8 construction. Alternately, materials 36 and 32 may be of different inherent compositions, but capable of being etched with the same etching chemistry.

Alternately where bridging material 32 comprises a material etchably different in composition from that of material 36, etching of bridging material 32 can comprise changing one or more of etching chemistry and etching conditions from those used in etching covering material openings 40.

Referring to FIG. 10, a conductive layer 52, for example titanium nitride, has been deposited to within covering material openings 40 and within base material openings 28 in electrical connection with node locations 15, 16, 17 and 18.

Figure 11:
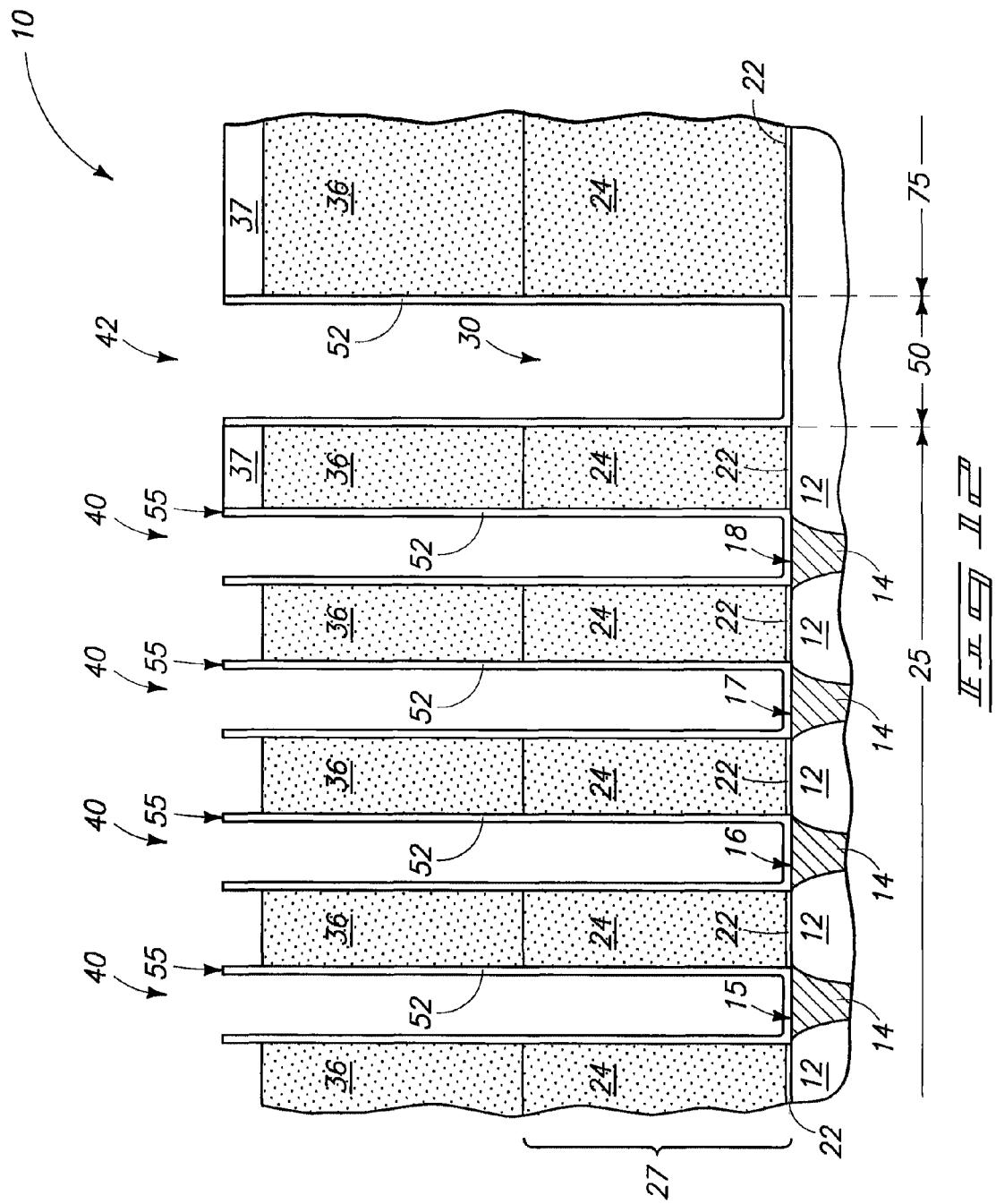
FIG. 11 is a view of the FIG. 10 substrate at a processing step subsequent to that shown by FIG. 10.

Referring to FIG. 11, conductive layer 52 and layers 38 and 39 have been etched or polished back to layer 37. Such provides, by way of example only, one manner of forming respective first capacitor electrodes 55 within covering material openings 40 and within base material openings 28 in electrical connection with node locations 15, 16, 17 and 18. The depicted first capacitor electrodes 55 are shown as being container in shape, but could of course be of other configurations whether existing or yet-to-be developed, including for example completely plugging the depicted capacitor openings.

Figure 13:
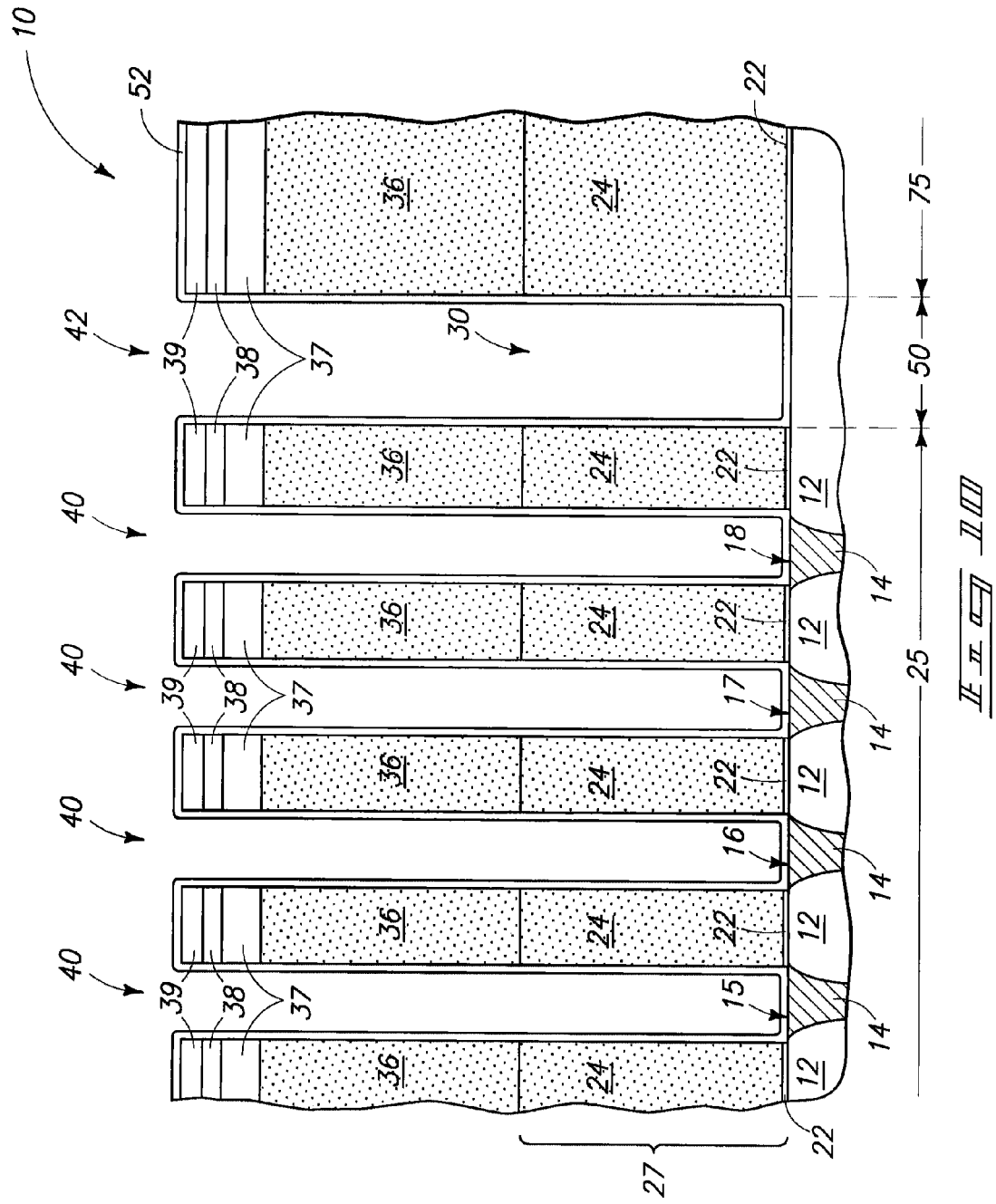
FIG. 13 is a diagrammatic top plan view of the FIG. 12 substrate fragment.

Referring to FIGS. 12 and 13, etch access openings 45 have been formed through masking layer 37 within capacitor array area 25 effective to expose material 36 of covering material 34 within capacitor array area 25. Such leaves elevationally outermost surfaces of material 36 within circuitry area 75 completely covered by masking layer 37. Etch openings 45 provide access for etchant to subsequently etch materials 36 and 34 within capacitor array area 25, if such is desired. Alternately by way of example only, it might be decided/desired to not etch material 36 in which event openings 45 might not be formed and masking layer 37 might not be used.

Referring to FIG. 14, materials 36 and 24 within capacitor array area 25 have been etched, for example with a liquid etching solution. FIG. 14 depicts but one embodiment wherein one or more etching chemistries has etched all of materials 36 and 24 from within capacitor array area 25. Alternately, less than all or only some of one or more of materials 36 and 24 might be etched. Further and regardless, any etching thereof might be conducted dry or with liquid. An example liquid etchant solution is aqueous, and regardless for example comprising HF. One example solution comprises 5:1 to 20:1 water to HF by volume, wherein said HF is a 42 weight percent solution of HF in water. An example etching temperature is room ambient, with an example etching pressure also being room ambient.

Figure 15:
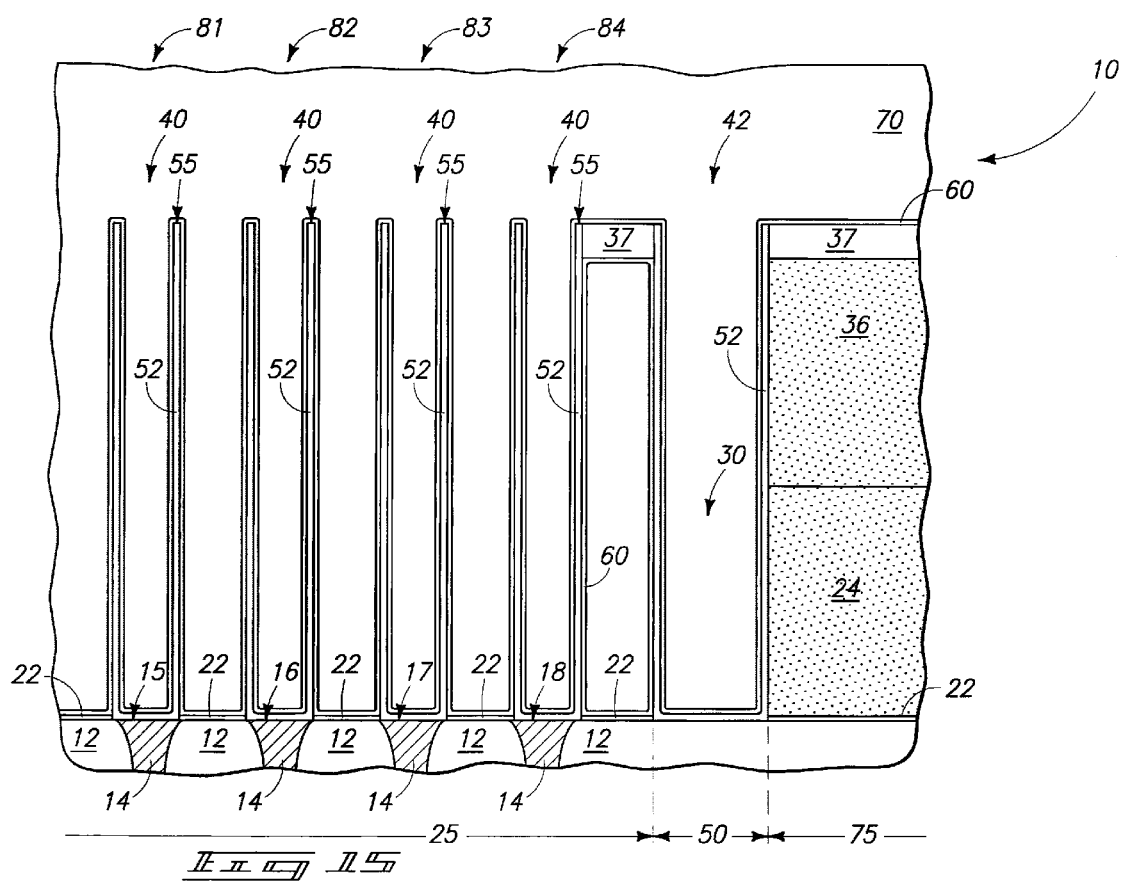
FIG. 15 is a view of the FIG. 14 substrate at a processing step subsequent to that shown by FIG. 14.

Referring to FIG. 15, a capacitor dielectric and a second capacitor electrode are formed operatively adjacent the first capacitor electrode with respect to individual capacitors. For example and by way of example only, FIG. 15 depicts the deposition of a capacitor dielectric layer 60. By way of example only, example materials are silicon dioxide, silicon nitride, silicon dioxide and silicon nitride composite, or any suitable high-k dielectric, and whether existing or yet-to-be developed. By way of example only, high-k dielectrics include $Ta_2O_5$ and barium strontium titanate.

Figure 16:
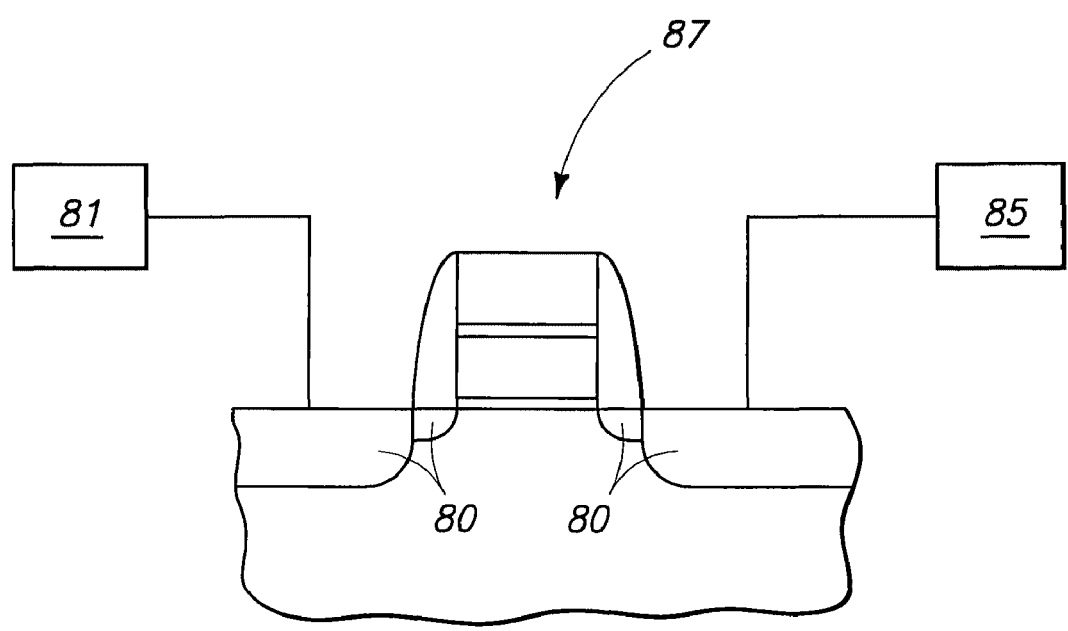
FIG. 16 is a diagrammatic representation of DRAM circuitry.

An outer capacitor electrode layer 70 has been deposited over capacitor dielectric layer 60, thereby defining capacitors 81, 82, 83 and 84. Such are depicted as comprising a common cell capacitor plate to all of the depicted capacitors, for example as might be utilized in DRAM or other circuitry. For example and by way of example only, FIG. 16 depicts an example DRAM cell incorporating capacitor 81. Such comprises an example transistor gate word line 87 having insulative sidewall spacers, and insulative cap, and a conductive region under the cap such as silicide, a conductive polysilicon region under the silicide, and a gate dielectric region under the polysilicon. Source/drain regions 80 are shown formed within semiconductive material operatively proximate word line 87. One of such electrically connects with capacitor 81, and another of such electrically connects with bitline 85.

In one embodiment, a method of forming a capacitor comprises providing material having an opening therein over a node location on a substrate. A shield is provided within and across the opening, with a void being received within the opening above the shield and a void being received within the opening below the shield. By way of example only, FIG. 8 is an example such opening if considering a single of one of the covering material openings 40 in combination with a single of one of the base material openings 28 immediately therebelow, with material 32 being provided within and across such opening. The space depicted above material 32 constitutes one example void received within the opening above a shield, and the space within the opening below shield material 32 constitutes another example void.

Etching is conducted within such opening through the shield, with FIG. 9 in but one example depicting an example such etching. After such etching, a first capacitor electrode is formed within the opening in electrical connection with the node location. A capacitor dielectric and a second capacitor electrode are formed operatively adjacent the first capacitor electrode, for example as described above. Any of the above described processing might be utilized in the context of such a method of forming a capacitor.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a capacitor, comprising:
    providing material having an opening therein over a node location on a substrate;
    providing a non-homogenous shield within and across the opening with a void being received within the opening above the shield and a void being received within the opening below the shield;
    etching within the opening through the shield;
    after the etching, forming a first capacitor electrode within the opening in electrical connection with the node location; and
    forming a capacitor dielectric and a second capacitor electrode operatively adjacent the first capacitor electrode.

2. The method of claim 1 wherein the shield comprises silicon dioxide-comprising material.

3. The method of claim 2 wherein the silicon dioxide-comprising material comprises at least one of H, Cl, and F.

4. The method of claim 3 wherein the silicon dioxide-comprising material comprises H.

5. The method of claim 3 wherein the silicon dioxide-comprising material comprises Cl.

6. The method of claim 3 wherein the silicon dioxide-comprising material comprises F.

7. The method of claim 1 wherein the shield comprises a polymer comprising C, H, and F.

8. The method of claim 1 wherein the shield comprises silicon dioxide-comprising material comprising at least one of H, Cl, and F, and comprises a polymer comprising C, H, and F.

9. A method of forming a capacitor within a base material having an opening therein over a node location on a substrate, comprising:
- forming bridging material across the base material opening, the bridging material having a non-planar outer surface, the base material opening comprising a void beneath the bridging material;
- forming covering material over the base material and the bridging material;
- etching an opening through the covering material to the bridging material received across the base material opening;
- etching through the bridging material through the covering material opening;
- forming a first capacitor electrode within the covering material opening and within the base material opening in electrical connection with the node location; and
- forming a capacitor dielectric and a second capacitor electrode operatively adjacent the first capacitor electrode.

10. The method of claim 9 comprising depositing the bridging material over the base material, and removing said bridging material from being received over the base material prior to said forming of covering material.

11. The method of claim 10 wherein said etching through the bridging material removes all remaining of said bridging material received over the base material opening from the substrate.

12. The method of claim 9 comprising planarizing the bridging material prior to said etching through the bridging material through the covering material opening.

13. The method of claim 12 wherein the planarizing forms the bridging material to have an outer planar surface which is coplanar with an outer planar surface of the base material.

14. A method of forming a capacitor within a base material having an opening therein over a node location on a substrate, comprising:
- depositing a bridging material over the base material across the base material opening and partially within the base material opening to bridge across the base material opening, the bridging material having a non-planar outer surface, the base material opening comprising a void beneath the bridging material;
- depositing covering material over the base material and over the bridging material that is received within the base material opening, the depositing of all of said covering material comprising a highest deposition temperature in degrees C. at which any of said covering material is deposited, the bridging material having a melting temperature in degrees C. which is at least 10% higher than said highest deposition temperature;
- etching an opening through the covering material to the bridging material received across the base material opening;
- etching through the bridging material through the covering material opening;
- forming a first capacitor electrode within the covering material opening and within the base material opening in electrical connection with the node location; and
- forming a capacitor dielectric and a second capacitor electrode operatively adjacent the first capacitor electrode.

15. The method of claim 14 comprising removing the bridging material from being received over the base material and to leave bridging material within and bridging across the base material opening prior to said depositing of covering material.

16. The method of claim 15 wherein said etching through the bridging material removes all remaining of said deposited bridging material from the substrate.

17. The method of claim 14 comprising planarizing the bridging material prior to said etching through the bridging material through the covering material opening.

18. The method of claim 17 wherein the planarizing forms the bridging material to have an outer planar surface which is coplanar with an outer planar surface of the base material.

19. A method of forming a capacitor within a base material received over a node location on a substrate, comprising:
- within a processing tool, etching an opening into the base material over the node location;
- after etching the base material opening and before removing the substrate from the processing tool thereafter, depositing a bridging material within the processing tool over the base material across the base material opening to bridge across the base material opening, the bridging material having a non-planar outer surface, the base material opening comprising a void beneath the bridging material;
- forming covering material over the base material and the bridging material;
- etching an opening through the covering material to the bridging material received across the base material opening;
- etching through the bridging material through the covering material opening;
- forming a first capacitor electrode within the covering material opening and within the base material opening in electrical connection with the node location; and
- forming a capacitor dielectric and a second capacitor electrode operatively adjacent the first capacitor electrode.

20. The method of claim 19 wherein depositing of the bridging material is to partially within the base material opening, and further comprising removing the bridging material from being received over the base material and to leave bridging material within and bridging across the base material opening before forming said covering material.

21. A method of forming a capacitor within a base material having an opening therein over a node location on a substrate, comprising:
- forming bridging material across the base material opening, the bridging material having a non-planar outer surface, the base material opening comprising a void beneath the bridging material;
- forming covering material over the base material and the bridging material;
- within a processing tool, etching an opening through the covering material to the bridging material received across the base material opening;
- within the processing tool and before removing the substrate therefrom after etching the covering material opening, etching through the bridging material through the covering material opening;
- forming a first capacitor electrode within the covering material opening and within the base material opening in electrical connection with the node location; and
- forming a capacitor dielectric and a second capacitor electrode operatively adjacent the first capacitor electrode.

22. The method of claim 21 wherein the etching an opening through the covering material comprises using an etching chemistry to extend the opening to the bridging material, the etching through the bridging material comprising continuing without ceasing processing of the substrate with the etching chemistry at the conclusion of the etching of the opening through the covering material effective to etch through the bridging material.

23. The method of claim 21 wherein the etching an opening through the covering material comprises using an etching chemistry and using etching conditions to extend the opening to the bridging material, the etching through the bridging material consisting essentially of continuing without ceasing processing of the substrate with the etching chemistry and with the etching conditions at the conclusion of the etching of the opening through the covering material effective to etch through the bridging material.

24. The method of claim 21 wherein the etching the bridging material comprises changing one of etching chemistry and etching conditions from those used in etching the covering material opening.

25. The method of claim 24 comprising changing etching chemistry.

26. The method of claim 24 comprising changing etching conditions.

27. The method of claim 24 comprising changing etching chemistry and etching conditions.

28. A method of forming a capacitor within a base material having an opening therein over a node location on a substrate, comprising:
   forming bridging material across the base material opening, the base material opening comprising a void beneath the bridging material;
   forming covering material over the base material and the bridging material, the covering material comprising an outer antireflective layer;
   etching an opening through the covering material to the bridging material received across the base material opening;
   etching through the bridging material through the covering material opening;
   forming a first capacitor electrode within the covering material opening and within the base material opening in electrical connection with the node location, the forming of the first capacitor electrode comprising removal of the outer antireflective layer; and
   forming a capacitor dielectric and a second capacitor electrode operatively adjacent the first capacitor electrode.

29. A method of forming a capacitor within a base material having an opening therein over a node location on a substrate, comprising:
   depositing a bridging material over the base material across the base material opening and partially within the base material opening to bridge across the base material opening, the base material opening comprising a void beneath the bridging material;
   depositing covering material over the base material and over the bridging material that is received within the base material opening, the depositing of all of said covering material comprising a highest deposition temperature in degrees C. at which any of said covering material is deposited, the bridging material having a melting temperature in degrees C. which is at least 10% higher than said highest deposition temperature, the covering material comprising an outer antireflective layer;
   etching an opening through the covering material to the bridging material received across the base material opening;
   etching through the bridging material through the covering material opening;
   forming a first capacitor electrode within the covering material opening and within the base material opening in electrical connection with the node location, the forming of the first capacitor electrode comprising removal of the outer antireflective layer; and
   forming a capacitor dielectric and a second capacitor electrode operatively adjacent the first capacitor electrode.

30. A method of forming a capacitor within a base material received over a node location on a substrate, comprising:
   within a processing tool, etching an opening into the base material over the node location;
   after etching the base material opening and before removing the substrate from the processing tool thereafter, depositing a bridging material within the processing tool over the base material across the base material opening to bridge across the base material opening, the base material opening comprising a void beneath the bridging material;
   forming covering material over the base material and the bridging material, the covering material comprising an outer antireflective layer;
   etching an opening through the covering material to the bridging material received across the base material opening;
   etching through the bridging material through the covering material opening;
   forming a first capacitor electrode within the covering material opening and within the base material opening in electrical connection with the node location, the forming of the first capacitor electrode comprising removal of the outer antireflective layer; and
   forming a capacitor dielectric and a second capacitor electrode operatively adjacent the first capacitor electrode.

* * * * *